US012745426B2

(12) United States Patent
Naylor et al.

(10) Patent No.: US 12,745,426 B2
(45) Date of Patent: Sep. 22, 2026

(54) METAL CHALCOGENIDE TRANSISTORS WITH DEFECTED CHANNEL TRANSITION LAYER

(71) Applicant: Intel Corporation, Santa Clara, CA (US)

(72) Inventors: Carl H. Naylor, Portland, OR (US); Kirby Maxey, Hillsboro, OR (US); Chelsey Dorow, Portland, OR (US); Sudarat Lee, Hillsboro, OR (US); Kevin O'Brien, Portland, OR (US); Ashish V. Penumatcha, Beaverton, OR (US); Scott B. Clendenning, Portland, OR (US); Uygar Avci, Portland, OR (US); Matthew Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 417 days.

(21) Appl. No.: 17/560,069

(22) Filed: Dec. 22, 2021

(65) Prior Publication Data

US 2023/0197860 A1 Jun. 22, 2023

(51) Int. Cl.
*H10D 30/67* (2025.01)
*H10D 62/80* (2025.01)
*H10D 99/00* (2025.01)

(52) U.S. Cl.
CPC ......... *H10D 30/6757* (2025.01); *H10D 99/00* (2025.01); *H10D 30/6739* (2025.01); *H10D 30/6755* (2025.01); *H10D 62/80* (2025.01)

(58) Field of Classification Search
CPC ............... H10D 30/6757; H10D 99/00; H10D 30/6739; H10D 30/6755; H10D 62/80; H10D 30/675; H10D 30/47; H10D 30/014; H10D 30/6735; H10D 62/53; H10D 62/235; B82Y 10/00
See application file for complete search history.

(56) References Cited

U.S. PATENT DOCUMENTS

| | | | | |
|---|---|---|---|---|
| 10,872,964 | B2 * | 12/2020 | Clifton | H10D 62/60 |
| 11,037,782 | B1 * | 6/2021 | Dahl | H01L 21/02546 |
| 2003/0034523 | A1 * | 2/2003 | Hiroshima | H10P 14/3816 257/E21.415 |
| 2007/0029618 | A1 * | 2/2007 | Walker | H10B 41/30 257/E29.302 |
| 2016/0284853 | A1 * | 9/2016 | Pham | H01L 23/3171 |
| 2018/0151763 | A1 * | 5/2018 | Heo | H10F 77/127 |

* cited by examiner

*Primary Examiner* — Caleb E Henry
*Assistant Examiner* — Kenneth Mark Sipling
(74) *Attorney, Agent, or Firm* — Essential Patents Group, LLP

(57) ABSTRACT

A metal chalcogenide material layer of lower quality provides a transition between a metal chalcogenide material layer of higher quality and a gate insulator material that separates the metal chalcogenide material layers from a gate electrode of a metal-oxide semiconductor field effect transistor (MOSFET) structure. Gate insulator material may be more readily initiated and/or or precisely controlled to a particular thickness when formed on lower quality metal chalcogenide material. Accordingly, such a material stack may be integrated into a variety of transistor structures, including multi-gate, multi-channel nanowire or nanosheet transistor structures.

12 Claims, 12 Drawing Sheets

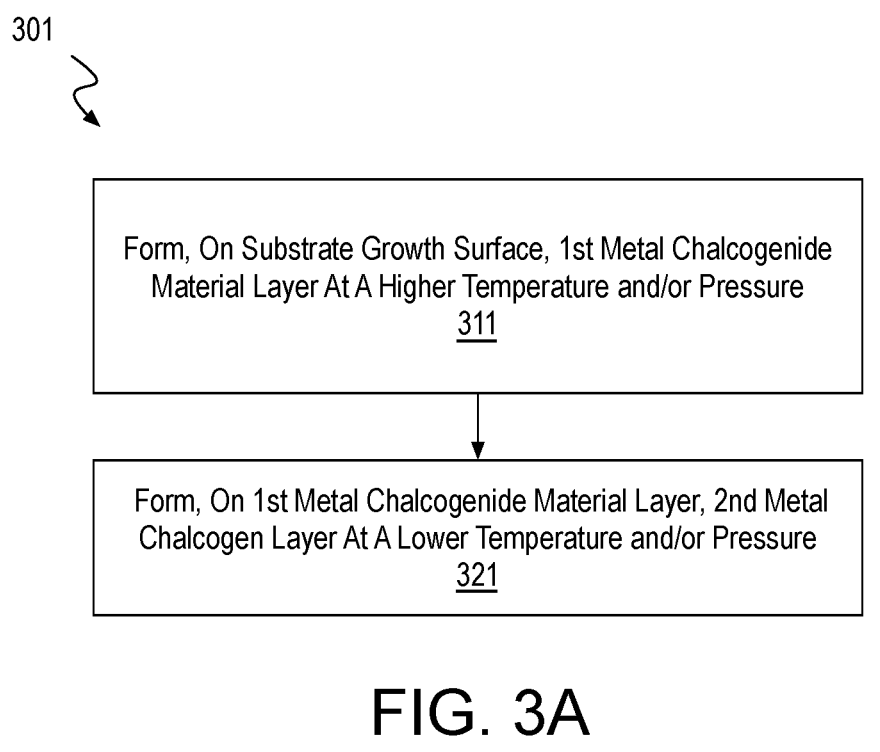

301

Form, On Substrate Growth Surface, 1st Metal Chalcogenide Material Layer At A Higher Temperature and/or Pressure
311

Form, On 1st Metal Chalcogenide Material Layer, 2nd Metal Chalcogen Layer At A Lower Temperature and/or Pressure
321

FIG. 3A

METAL CHALCOGENIDE TRANSISTORS WITH DEFECTED CHANNEL TRANSITION LAYER

BACKGROUND

Scaling of features in integrated circuits (ICs) has been a driving force in the semiconductor device industry. Scaling to smaller features enables increased densities of functional units within a semiconductor chip. The scaling of transistors that include silicon-based channel materials has become more challenging with gate dimensions now less than 5 nm.

It has become increasingly important to develop non-silicon-based materials suitable as transistor channels. Some examples of non-silicon-based channel materials include metal chalcogenides. For example, one or more molecular monolayers of a metal chalcogenide material may be used as a channel in a variety of transistor architectures. However, integrating metal chalcogenide materials with a gate insulator material of precisely controlled thickness has proved challenging.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 3A, 3B and 3C are flow charts of methods of fabricating a high quality metal chalcogenide channel material and a defected metal chalcogenide channel transition layer, in accordance with some embodiments;

DETAILED DESCRIPTION OF EXEMPLARY EMBODIMENTS

Figure 1:
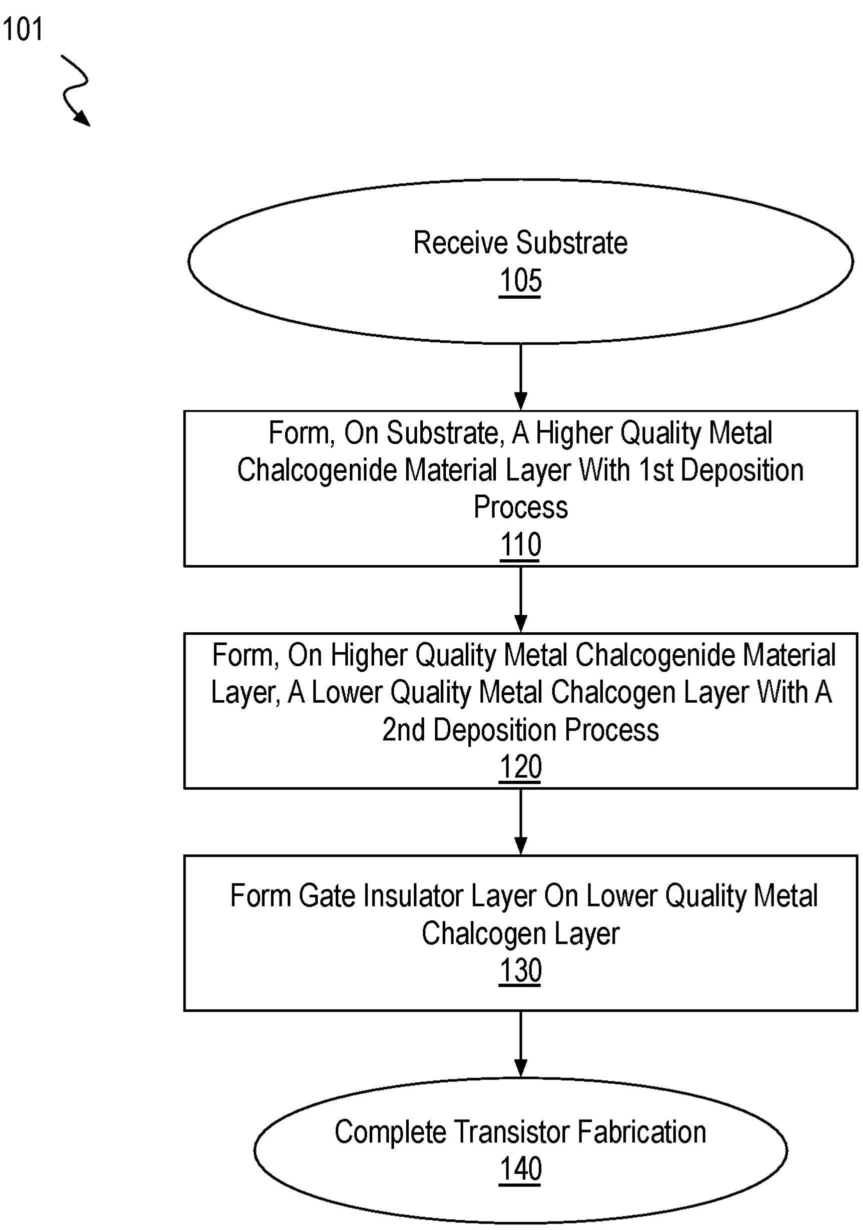
FIG. 1 is a flow chart of methods of fabricating a transistor with a defected metal chalcogenide channel transition layer, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to “an embodiment” or “one embodiment” or “some embodiments” means that a particular feature, structure, function, or characteristic described in connection with the embodiment is included in at least one embodiment. Thus, the appearances of the phrase “in an embodiment” or “in one embodiment” or “some embodiments” in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term “adjacent” here generally refers to a position of a thing being next to (e.g., immediately next to or close to with one or more things between them) or adjoining another thing (e.g., abutting it).

As used in the description and the appended claims, the singular forms “a”, “an” and “the” are intended to include the plural forms as well, unless the context clearly indicates otherwise. It will also be understood that the term “and/or” as used herein refers to and encompasses any and all possible combinations of one or more of the associated listed items.

The terms “coupled” and “connected,” along with their derivatives, may be used herein to describe functional or structural relationships between components. These terms are not intended as synonyms for each other. Rather, “connected” may be used to indicate that two or more elements are in direct physical, optical, or electrical contact with each other. “Coupled” may be used to indicated that two or more elements are in either direct or indirect (with other intervening elements between them) physical or electrical contact with each other, and/or that the two or more elements co-operate or interact with each other (e.g., as in a cause-and-effect relationship).

The terms “over,” “under,” “between,” and “on” as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

As described below, a metal chalcogenide material layer of lower quality provides a transition between a metal chalcogenide material layer of higher quality and a gate insulator material that separates the metal chalcogenide material layers from a gate electrode of a metal-oxide semiconductor field effect transistor (MOSFET) structure. The inventors have found that gate insulator material can be more readily initiated and/or or precisely controlled to a particular thickness when formed on a lower quality metal chalcogenide material. Although not bound by theory, the inventors currently understand a more defected metal chalcogenide material to have a higher density of impurities and/or grain boundaries, which may provide a greater density of dangling chemical bonds than a less defected metal chalcogenide material that may be advantageous to include within a channel region of a transistor structure.

FIG. 1 is a flow chart of methods 101 for fabricating a transistor with a high quality metal chalcogenide channel layer and a defected metal chalcogenide channel transition layer, in accordance with some embodiments. FIGS. 2A, 2B, 2C and 2D illustrate cross-sectional views of a portion of a transistor structure evolving as methods 101 are practiced, in accordance with some embodiments.

At input 105 a growth substrate is received. The growth substrate may be any known to be suitable for the formation of a crystalline metal chalcogenide material layer upon a growth surface of the substrate. In some exemplary embodiments, the growth substrate received at input 105 comprises a substantially monocrystalline growth surface.

Methods 101 continue at block 110 where a layer of metal chalcogenide material is formed on the substrate's growth surface by practicing a first deposition or growth process. In exemplary embodiments, the first deposition or growth process leads to the formation of a higher quality/less defected crystalline metal chalcogenide material layer. In the example illustrated in FIG. 2A, a crystalline metal chalcogenide material layer 204 has been epitaxially grown upon a substantially monocrystalline growth surface of substrate 201.

Substrate 201 may include any number of material layers and structures with a top surface being a monocrystalline seeding surface upon which metal chalcogenide material layer 204 is formed. The growth surface may comprise any material know to be suitable to support a growth of crystalline metal chalcogenide material layer 204, for example having a similar crystallinity and lattice constant, coefficient of thermal expansion, etc. Although not illustrated, substrate 201 may include a variety of material layers, such as, but not limited to monocrystalline silicon, germanium, silicon germanium alloys, group III-N alloys or a group III-V compound alloys. Logic device structures, such as any known MOSFET structures, may also be embedded within substrate 201.

Figure 2A:
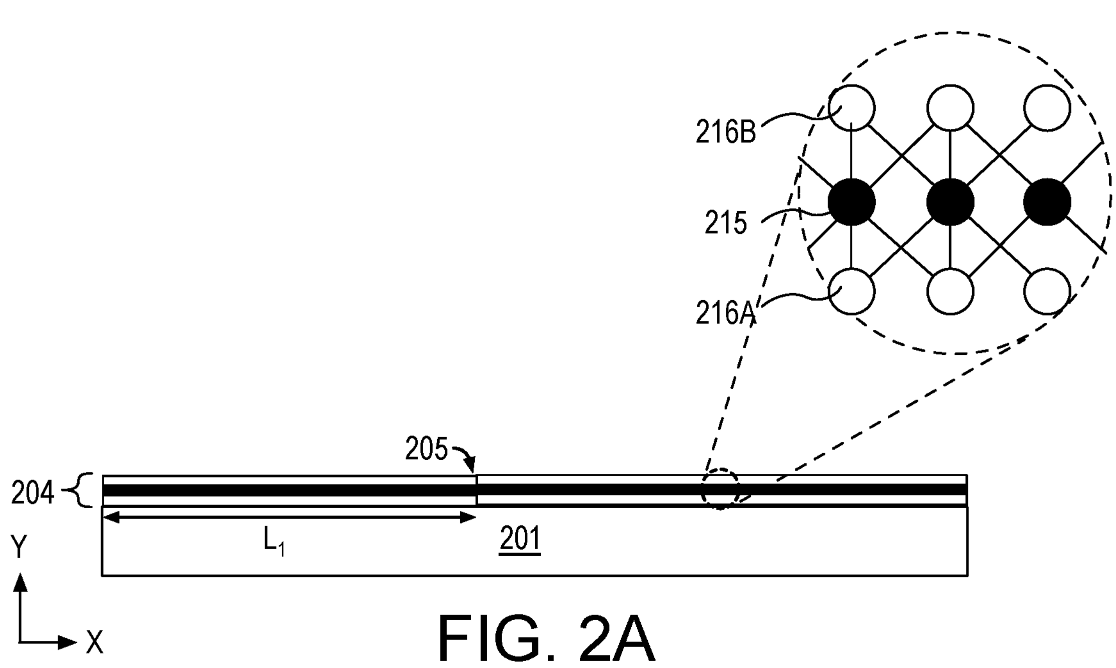
FIGS. 2A, 2B, 2C and 2D illustrate cross-sectional views of a portion of a transistor structure evolving as the methods illustrated in FIG. 1 are practiced, in accordance with some embodiments.

As shown in FIG. 2A, a crystalline metal chalcogenide material layer 204 comprises lamellas indicative of long range atomic order within the material layer. Depending on arrangements of the atoms, metal chalcogenide material layer 204 can have various crystal orientations, such as trigonal prismatic (hexagonal), octahedral (tetragonal, T) or distorted phase (TO). In the illustrated embodiments, metal chalcogenide material layer 204 has predominantly hexagonal crystallinity.

Metal chalcogenide material layer 204 may be substantially monocrystalline having few, if any, crystal defects and/or grain boundaries within the substrate area occupied by layer 204. In the illustrated embodiment, metal chalcogenide material layer 204 has one dislocation defect 205. Dislocation defect 205 may be a grain boundary, or not. If more than one grain is present within material layers 204, a largest lateral grain length $L_1$ may, for example, range from many tens of nanometers to a thousand nanometers, or more.

Metal chalcogenide material layer 204 is a compound comprising primarily one or more metals and one or more chalcogens. As used herein, chalcogens include sulfur (S), selenium (Se) or tellurium (Te). Metal chalcogenide material layer 204 may comprise any metal(s) that can a form crystalline chalcogenide compound that is a semiconductor. In exemplary embodiments, metal chalcogenide material layer 204 comprises at least one of molybdenum (Mo), tungsten (W) or chromium (Cr).

The expanded of FIG. 2A illustrates one molecular monolayer of an exemplary metal dichalcogenide ($MX_2$) where M represents metal atoms 215 sandwiched between a lower layer of a chalcogen atoms 216A and an upper layer of chalcogen atoms 216B. One monolayer of metal chalcogenide material layer 204 has a thickness of approximately 0.7 nm, and metal chalcogenide material layer 204 may have one or more such layers. Although metal chalcogenide material layer 204 may be advantageously a dichalcogenide as depicted in the expanded view, some metals have several oxidation states such that x may vary, for example between about 0.2 and 4 for different stoichiometric embodiments of metal chalcogenide material layer 204.

Returning to FIG. 1, methods 101 continue at block 120, where a layer of lower quality/more defected metal chalcogenide material is formed on the higher quality/less defected crystalline metal chalcogenide material layer by practicing a second deposition or growth process. In the example illustrated in FIG. 2A, another metal chalcogenide material layer 206 has been formed upon metal chalcogenide material layer 204. In exemplary embodiments, metal chalcogenide material layer 204 is epitaxial to metal chalcogenide material layer 206 (i.e., has the same crystal orientation as metal chalcogenide material layer 206). However, metal chalcogenide material layer 206 is more defected than metal chalcogenide material layer 204. In other words, metal chalcogenide material layer 206 has significantly more crystal defects and/or is of lower crystal quality than metal chalcogenide material layer 204. Because there are more defects within metal chalcogenide material layer 206, some number of additional defects originate within metal chalcogenide material layer 206 in contrast to simply propagating from metal chalcogenide material layer 204.

Although the crystal defects that originate within metal chalcogenide material layer 206 may be point defects consisting of a single displaced atom, defected regions may entail hundreds, or even thousands, of displaced atoms. As such, defected regions may be readily evident in transmission electron microscopy (TEM) imagery at a magnification less than that needed to image lattice structure and resolve individual point defect. Alternatively, Raman spectroscopy may be employed to identify the presence of particular metal(s) and chalcogen(s) within metal chalcogenide material layers 204 and 206, as well as quantify the quality of their crystal structures, for example based on Raman A1/E1 peak widths.

In some embodiments, metal chalcogenide material layer 206 has more dislocations extending through its thickness than does metal chalcogenide material layer 204. Such dislocation defects may demark grain boundaries or be contained within a monocrystalline grain.

Figure 2B:
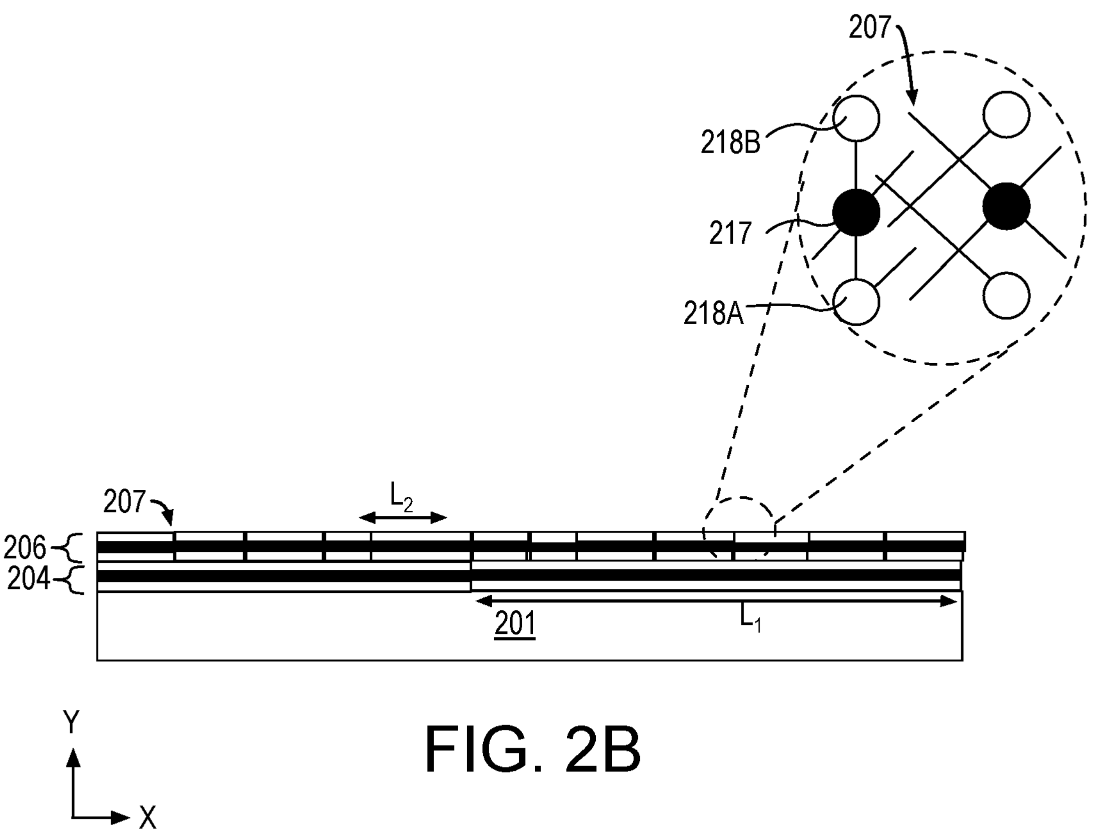

In the example illustrated in FIG. 2B, dislocation 207 originates within metal chalcogenide material layer 206 rather than propagating from a dislocation defect within metal chalcogenide material layer 204. In the illustrated embodiment, metal chalcogenide material layer 206 has at least a 10× greater dislocation density than metal chalcogenide material layer 204. Where dislocation defects are associated with grain boundaries, metal chalcogenide material layer 206 may be characterized significantly more polycrystalline than metal chalcogenide material layer 204. For such polycrystalline metal chalcogenide material layers, largest grains within metal chalcogenide material layer 206 have a lateral length $L_2$ that is significantly smaller than lateral length $L_1$ of a largest grain within metal chalcogenide material layer 204 along a same sectional plane.

The expanded view inset of FIG. 2B illustrates one molecular monolayer of an exemplary metal dichalcogenide material layer 206 having metal atoms 217 sandwiched between a lower layer of chalcogen atoms 218A and an upper layer of chalcogen atoms 218B. Along dislocation 207, one or more dangling bonds are present. Compositionally, metal chalcogenide material layer 206 is a compound again comprising primarily one or more metals and one or more chalcogens. Metal chalcogenide material layer 206 may comprise any of the same metal(s) suitable for metal chalcogenide material layer 204, such as Mo, W, Cr. In exemplary embodiments, metal chalcogenide material layer 206 includes primarily the same metal(s) as metal chalcogenide material layer 204. In some such embodiments, metal chalcogenide material layer 206 includes primarily the same chalcogen (s) as in metal chalcogenide material layer 204 so that a primary difference between difference between metal chalcogenide material layer 204 metal chalcogenide material layer 206 is the density of crystal defects. Hence, in some embodiments metal chalcogenide material layer 206 is also dichalcogenide, and may also have predominantly the same crystallinity as metal chalcogenide material layer 204 (e.g., both hexagonal with the c-axis normal to the x-y plane of substrate 201, as depicted).

Returning to FIG. 1, methods 101 continue at block 130, where a gate insulator material is deposited upon a surface of the defected metal chalcogenide material. In exemplary embodiments, an atomic layer deposition (ALD) process is practiced at block 130 to form an insulator comprising primarily a metal and oxygen. Although the metal constituent(s) may vary, in exemplary embodiments, the metal of the insulator material is different than the metal of the metal chalcogenide material.

Figures 2C, 2D:
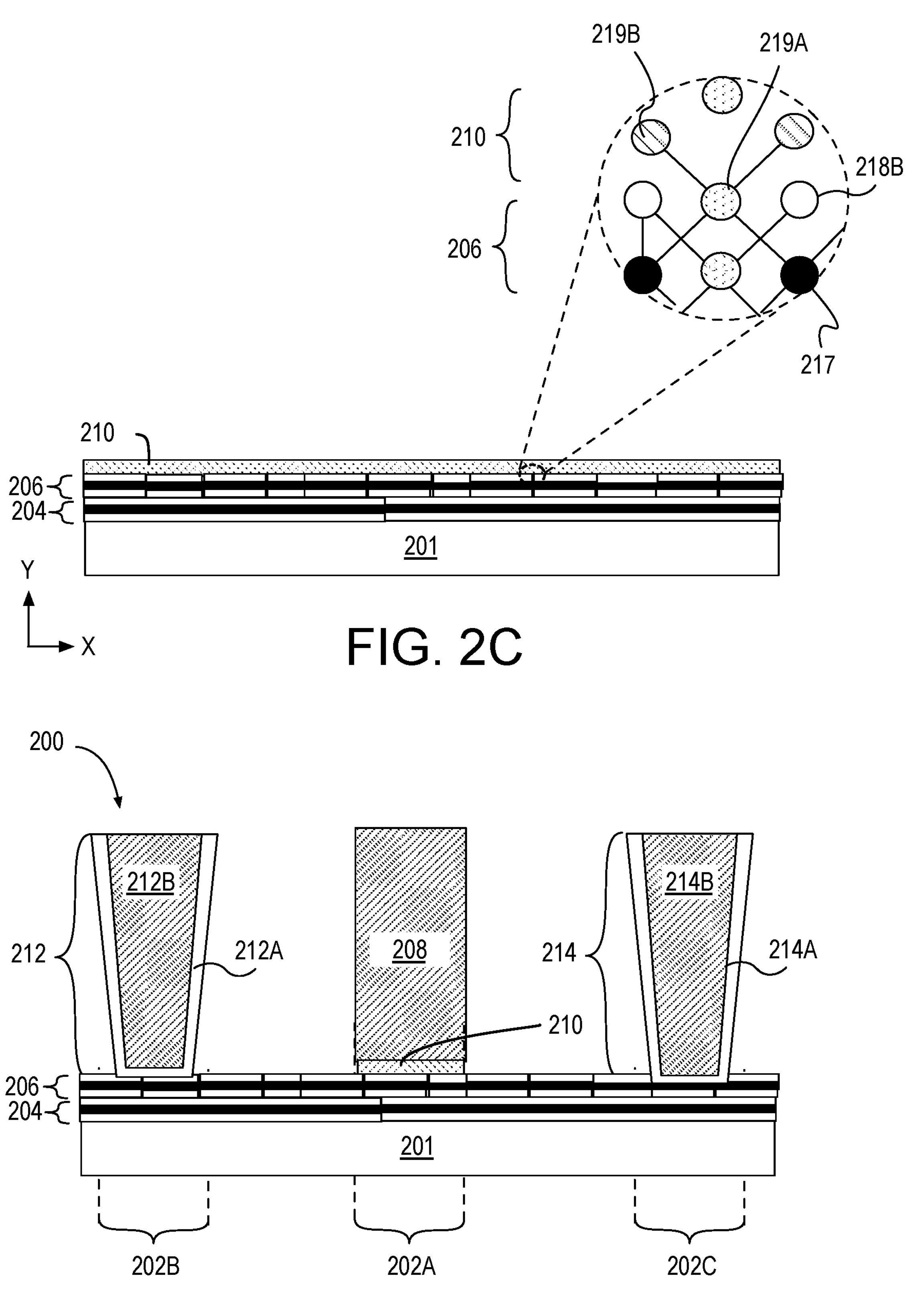

In the example illustrated in FIG. 2C, a gate insulator 210 has been deposited in contact with a surface of metal chalcogenide material layer 206. As shown in the expanded view inset of FIG. 2C, gate insulator 210 comprises oxygen atoms 219A and metal atoms 219B. Although the composition of gate insulator 210 may vary, in some examples insulator 210 comprises primarily hafnium and oxygen ($HfO_x$). As shown, oxygen atoms 219A may enter dislocation 207 to satisfy dangling bonds and other sites within metal chalcogenide material 206 where activation energy is lowest. Through this nucleation enhancement, the thickness of the insulator 210 may be advantageously control to less than 5 nm, and even less than 1 nm. Defects and/or dangling chemical bonds the surface of metal chalcogenide material layer 206 may therefore facilitate the insulator ALD process to the extent that the thickness of gate insulator 210 deposited at block 130 (FIG. 1) can be controlled to nanometer precision and uniformity over an area of the substrate.

With the improved control over the insulator deposition, methods 101 (FIG. 1) end at output 140 where a transistor structure is completed according to any techniques known to be suitable. In the example further illustrated in FIG. 2D, a planar transistor 200 is fabricated upon the prepared metal chalcogenide material layers. As shown, a gate electrode 208 is formed above a channel region 202A of the metal chalcogenide material layers 204, 206 with at least a portion of gate insulator 210 retained between gate electrode 208 and the defected metal chalcogenide material layer 206, that transitions to metal chalcogenide material layer 204.

Transistor 200 further includes a source terminal 212 coupled to one end 202B of metal chalcogenide material layers 204, 206 and a drain terminal 214 coupled to another end 202C of metal chalcogenide material layers 204, 206. In the example illustrated, source terminal 212 includes a barrier layer 212A and a fill metal 212B. In some examples, barrier layer 212A includes a material such as tantalum nitride or ruthenium. Fill metal 212B may be a metal such as cobalt, copper or tungsten, for example. Drain terminal 214 similarly includes a barrier layer 214A and a fill metal 214B, which may also comprise tantalum nitride or ruthenium, and cobalt, copper or tungsten, for example.

Figure 3B:
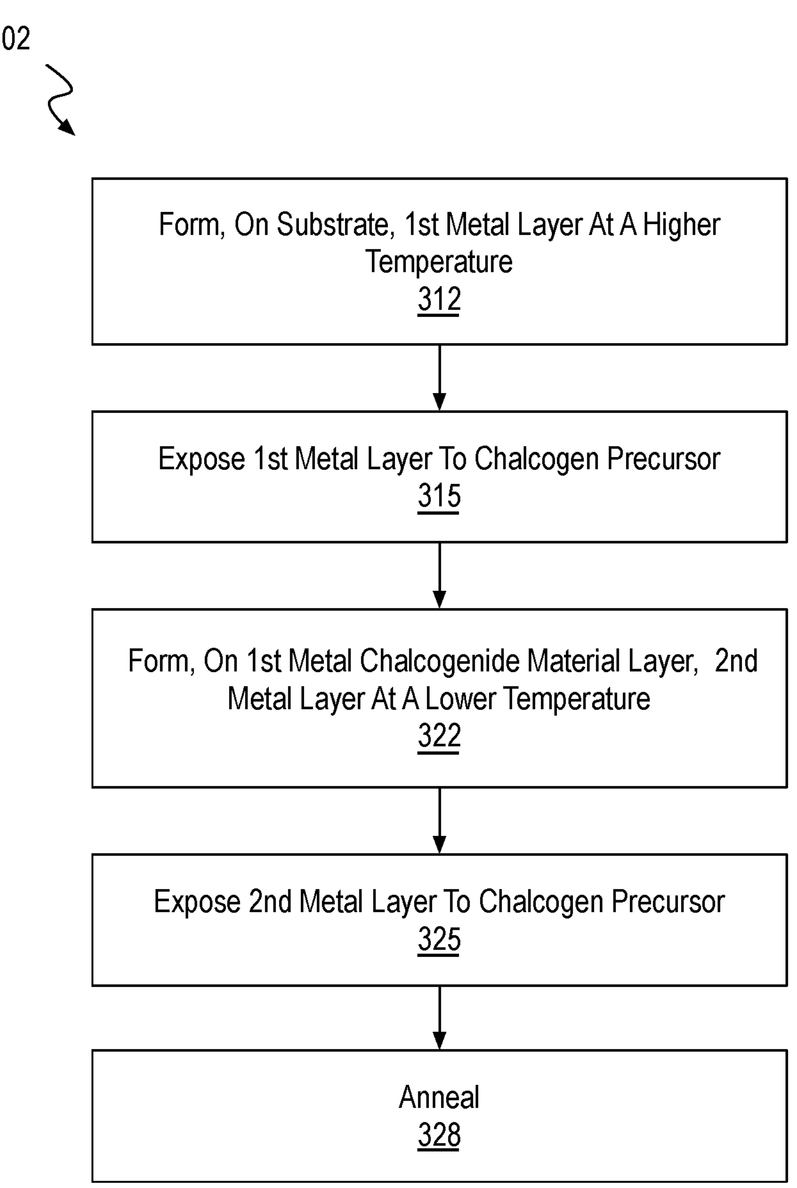
Figure 3C:
Figure 3C:
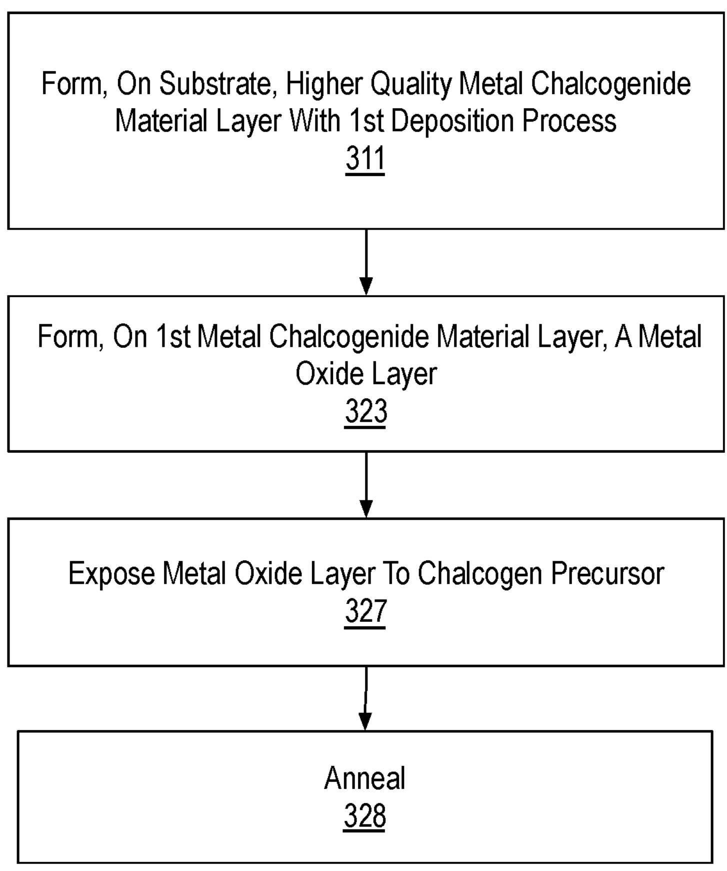

FIG. 3A-3C illustrate some exemplary methods 301-303, respectively, for fabricating a high quality metal chalcogenide channel layer and a defected metal chalcogenide channel transition layer, in accordance with some embodiments. Any of methods 301-303 may be practiced, for example, as part of methods 101 (FIG. 1). Referring first to FIG. 3A, methods 301 begin at block 311 where a first metal chalcogenide material layer is grown on the substrate seeding surface (e.g., with an MOCVD or MBE epitaxial growth process) at a reference temperature, pressure, and precursor fluxes known to provide high(est) crystal quality and/or purity. Such a growth process may be executed in a first growth chamber, for example.

At block 321, a second metal chalcogenide material layer is grown directly on the metal chalcogenide material layer that was grown at block 311. The growth process (e.g., MOCVD or MBE) at block 321 is with conditions that deviate from the reference conditions employed at block 311 so that the crystal quality and/or purity is reduced. For example, the growth process at block 321 may be performed at a second temperature, different (e.g., lower) than the reference temperature. Although such a temperature difference may vary in magnitude, in some examples the second temperature is at least 100° C. lower than the reference temperature. The growth process at block 321 may also be performed at a different (e.g., lower) pressure than the reference pressure. The growth process at block 321 may also be performed at different precursor fluxes than the reference fluxes enlisted at block 311. Two or more of these growth process parameters may be also varied between blocks 311 and 321 to induce more defects and/or impurities into the metal chalcogenide material grown at block 321. Such a second growth process may be executed in a second growth chamber, for example.

Referring next to FIG. 3B, methods 302 begin at block 312 where a first metal layer is deposited on the substrate surface, for example with a first deposition process, at a first reference temperature, pressure, and precursor flux. At block 315 the first metal layer is exposed to a chalcogen precursor at a second reference temperature, pressure, and flux, doping the first metal layer with the chalcogen to a desired concentration. In some examples, block 315 comprises heating the workpiece to over 100° C. (e.g., 125° C., 150° C., 200° C., or 250° C.) while exposing the top surface of the first metal layer to a chalcogenide precursor gas. The precursor gas may have various compositions, with some examples including $H_2S$, $H_2Se$, $H_2Te$. These gaseous precursor compounds may readily degrade to their respective elements at the elevated temperature of the heated substrate. These exemplary precursor gases can also act as strong reducing agents, so they may be combined or replaced with weaker reducing agents/stronger oxidizing agents. Gases including oxygen, for example, temper the reducing strength more than those that lack oxygen. In some embodiments, $SO_2$ or $SeO_2$ may be introduced in combination with, or to the exclusion of, $H_2S$ or $H_2Se$, for example. Other gases, such as, $NH_3$, $N_2$, Ar, $N_2O$, or $S_xO_y$, $Se_xO_y$, $Te_xO_y$ with x or y being 1, 2 (e.g., $SO_2$, $SeO_2$) or 3, or $SF_z$, $Se_z$ or $Te_z$ with z either 4 or 6 (e.g., $SF_6$, $TeF_6$) may also be introduced in combination with one or more of $H_2S$ and, $H_2Se$ and or $H_2Te$.

Methods 302 continue at block 322 where a second metal layer is formed on the first metal chalcogenide material layer, with another deposition process, at a third temperature, pressure, and precursor flux. In some embodiments, at least one of the third temperature, pressure, or precursor flux deviates from the first reference temperature, pressure and precursor flux. For example, the third temperature may be lower (e.g., by at least 100° C.) than the first reference temperature, which may significantly reduce surface mobility of the metal precursor, leading to vacant metal sites and/or grain boundaries within the second metal layer.

Methods 302 continue at block 325 where the second metal layer is exposed to a chalcogen precursor. In some embodiments block 325 is performed at the reference conditions employed at block 315 in reliance on defects having been induced at block 322. However, parameters of the process performed at block 325 may also be altered from the second reference conditions employed at block 315. Also, in alternative embodiments block 322 may be performed with the first reference conditions in reliance on defects being induced by enlisting process parameters at block 325 that deviate from the second reference conditions employed at block 315.

Methods 302 complete with a transient thermal process at block 328 that may ensure the conversion of metal and chalcogen species into a crystalline metal chalcogenide (e.g., $MC_x$). Block 328 may comprise a furnace anneal, a flash anneal, or laser anneal, for example. A furnace anneal (or other anneal) may be performed in a forming gas or other ambient at a predetermined temperature and duration sufficient to form metal chalcogenide. The anneal performed at block 328 may be at a higher temperature than the temperature at which the chalcogen dopant is introduced a blocks 315 and/or 325. In some embodiments, the anneal is performed at a temperature of at least 350° C. and may be in the range of 400-600° C.

In FIG. 3C, methods 303 again begin at block 311 where the first metal chalcogenide material layer is grown on the substrate seeding surface (e.g., with an MOCVD or MBE epitaxial growth process) at a reference temperature, pressure, and precursor fluxes known to provide high(est) crystal quality and/or purity. At block 323, a metal oxide material layer is growth or deposited on the first metal chalcogenide material layer, and at block 327, the metal oxide material is doped through exposure to a chalcogen precursor. An anneal at block 328 may be similarly performed to convert the metal oxide material into a second metal chalcogenide material layer. Such an oxide to chalcogenide conversion process may result in a metal chalcogenide material with significantly different properties than the metal chalcogenide material epitaxially grown at block 311, and one or more of these properties may facilitate the subsequent formation of a gate insulator, for example substantially as described above.

Methods 101 and 301-303 may be integrated into a variety of transistor fabrication processes to fabricate non-planar transistors as well as the planar transistor 200 illustrated in FIG. 2A-2D. FIG. 4A-4G illustrate cross-sectional and isometric views of a portion of a multi-channel, multi-gate transistor structure evolving as methods 101 are practiced, in accordance with some embodiments.

Figure 4A:
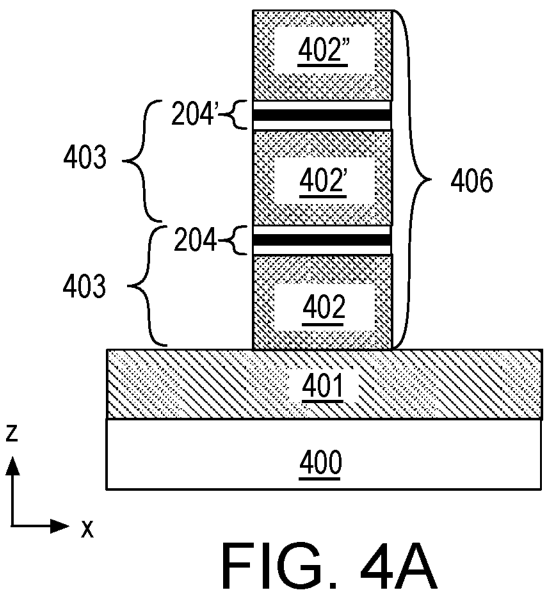
FIGS. 4A, 4B, 4C, 4D, 4E, 4F and 4G illustrate a cross-sectional and isometric views of a portion of a multi-channel, multi-gate transistor structure evolving as the methods illustrated in FIG. 1 are practiced, in accordance with some embodiments.

FIG. 4A is a cross-sectional illustration of multi-layered feature 406 over a substrate 400 with an intervening growth template layer 401. Substrate 400 may be a large format (e.g., 300-450 mm) wafer of monocrystalline semiconductor material or sapphire. For semiconductor embodiments, the wafer may include a Group IV semiconductor material layer (e.g., Si, Ge, SiGe, GeSn, etc.), a Group III-V semiconductor material layer, or a Group II-VI semiconductor material layer, for example. Substrate 400 may include one or more underlying device layers including a semiconductor material layer. Substrate 400 may also have one or more interconnect levels interconnecting devices (e.g., transistors) of the device layers. Substrate 400 may also include a glass or other amorphous material layer.

Growth template layer 401 may be any monocrystalline material having a crystallinity suitable for seeding an epitaxially metal chalcogenide growth. In an embodiment, growth template layer 401 is formed by MOVCD epitaxy. In some embodiments, growth template layer 401 is a III-N layer, for example binary GaN, which may be grown to a thickness in the range of 100 nm-5 micrometers. Although not illustrated in FIG. 4A, substrate 400 may include one or more buffer layers to overcome lattice and thermal mismatch between growth template layer 401 and other layers of substrate 400. For example, a buffer layer may include nitrogen and one or more of, Al, In or Ga (i.e., AlzGa1-zN, AlwIn1-wN, or AlN).

Multi-layered feature 406 comprises a stack of bilayers 403. A first, lower, bilayer 403 includes a metal chalcogenide material layer 204 on an intervening material layer 402. A second, upper, bilayer 403 includes a metal chalcogenide material layer 204' on an intervening material layer 402'. Upper bilayer 403 is capped with a material layer 402". In some embodiments, the layers 402, 402' and 402" are a group III-N material including one or more of Al or In. In an exemplary embodiment, layers 402, 402' and 402" are AlN, which has a good lattice match with some advantageous metal chalcogenide crystals, such as MX2. The layers 402, 402' and 402" may have a thickness of between 6 and 8 nm, for example.

Metal chalcogenide material layer 204 may be similarly formed with MOCVD or MBE processes, for example. Metal chalcogenide material layer 204 may have any of the metal chalcogenide compositions described above and may have any of the crystallinities described above. Metal chalcogenide material layer 204' advantageously has substantially the same composition and crystallinity as metal chalcogenide 204. Metal chalcogenide material layers 204 and 204' may have anywhere from 1 to 10 molecular monolayers, for example, and the two layers advantageously have substantially the same number of monolayers. Although multi-layered feature 406 is illustrated with two metal chalcogenide material layers 204, 204,' the process to form bilayers 403 may be repeated for any number of metal chalcogenide material layers (e.g., 3, 4, 5, etc.).

Figure 4B:
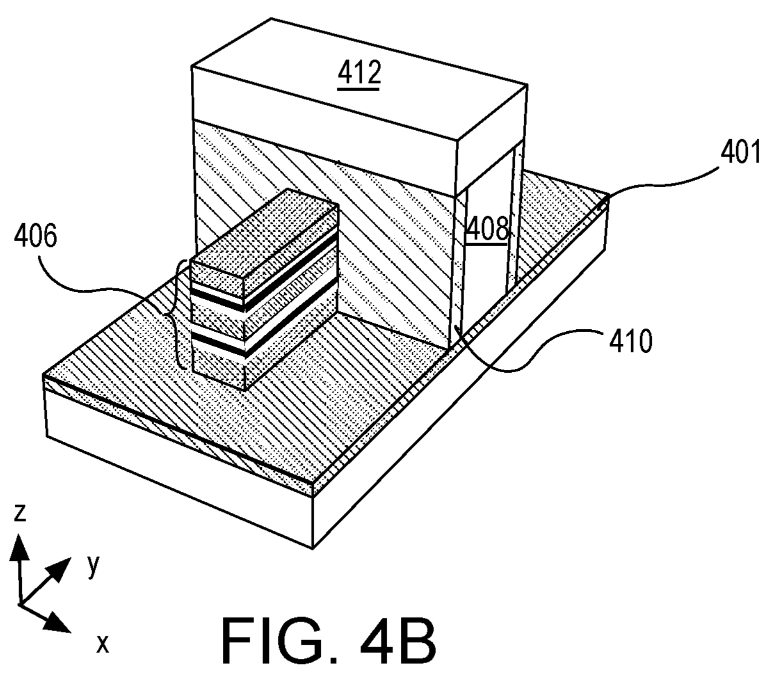

FIG. 4B an isometric illustration following the formation of a gate mask 408 over a first portion of multi-layered feature 406. Gate mask 408 has a lateral width, for example in the y-dimension, that defines a width of a transistor gate and/or length of channel that is to be formed. In the example shown, sidewall spacers 410 are adjacent to gate mask 408 and a hardmask cap 412 is over gate mask 408. Sidewall spacers 410 and hardmask cap 412 may be any dielectric material, comprising, for example silicon, oxygen, and/or nitrogen and/or carbon.

Figures 4C, 4D:
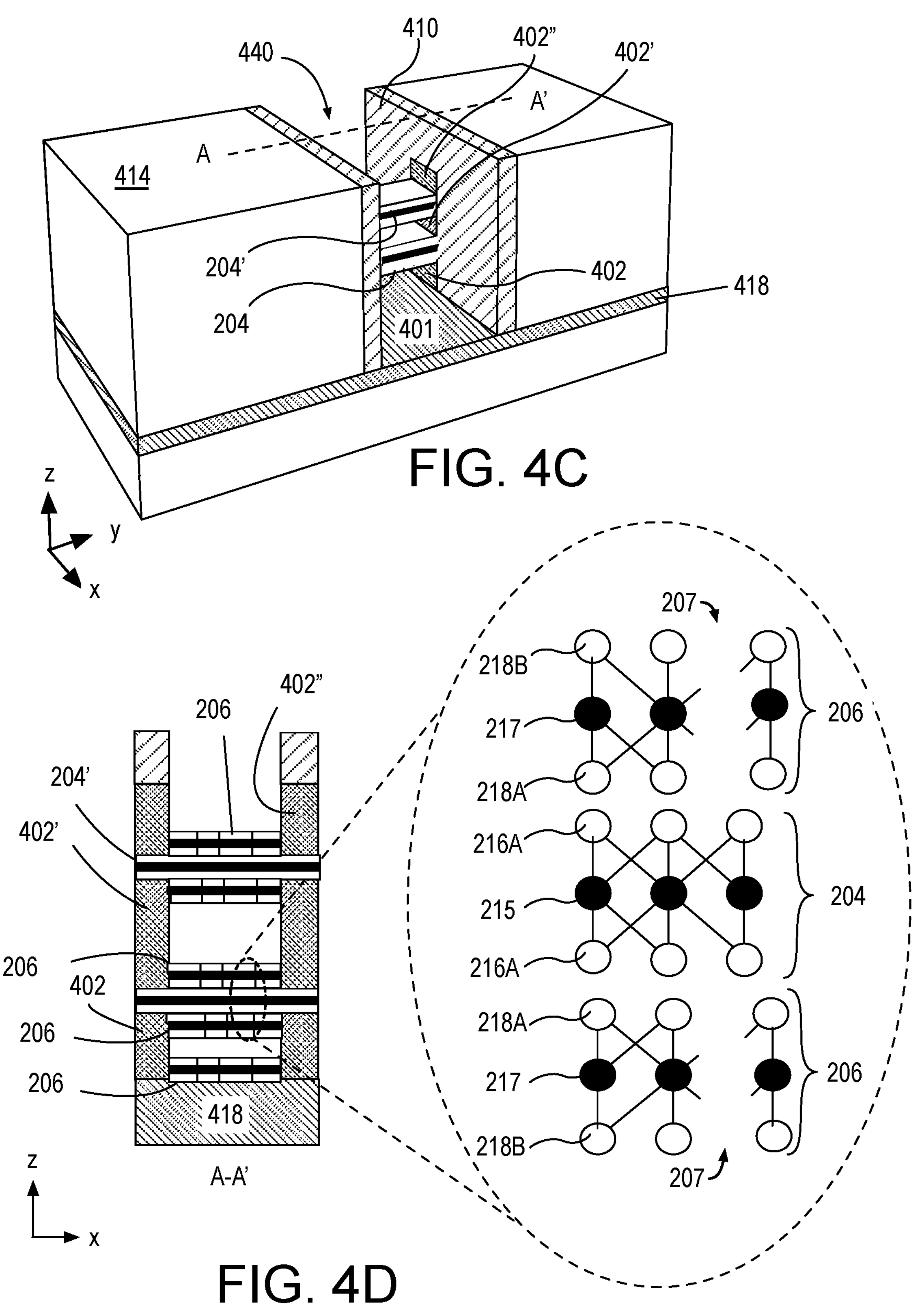

FIG. 4C illustrates the structure in FIG. 4B following removal of gate mask 408. Gate mask removal exposes portions of the intervening material layers 402, 402' and 402," which are etched away from between channel portions of metal chalcogenide material layers 204 and 204'. In an embodiment, a wet chemical etch selectively removes intervening material layers 402, 402' and 402," retaining metal chalcogenide material layers 402 and 402', sidewall spacers 410, and a surrounding dielectric material 414. As a function of its composition, growth template layer 418 may be retained as illustrated, or at least partially etched along with intervening material layers 402, 402' and 402".

As shown in the cross-sectional view of FIG. 4D taken along the A-A' line shown in FIG. 4C, metal chalcogenide material layer 206 is formed on the exposed top and bottom surfaces (and sidewalls) of metal chalcogenide material layers 204 and 204'. Any method to form metal chalcogenide material layer 206 with lower quality (e.g., methods 301-303) may be practiced to concurrently form such material completely around the exposed channel portions of metal chalcogenide material layers 204 and 204'. Metal chalcogenide material layer 206 may be grown to a thickness of 1-3 monolayers, for example. As shown, metal chalcogenide material layer 206 forms on exposed portions of metal chalcogenide material layers 204 and 204' with end portions of metal chalcogenide material layers 204 and 204' remaining embedded between intervening material layers 402, 402' and 402". In the illustrated example, metal chalcogenide material layer 206 also forms on exposed portions of growth template layer 418.

The expanded view inset of FIG. 4D further illustrates exemplary MX2 dichalcogenide crystal structures of metal chalcogenide material layer 206 on top and bottom surfaces of an exemplary MX2 metal chalcogenide material layer 204. As shown, a higher density of dislocations 207 within metal chalcogenide material layer 206 are associated with various unsatisfied chemical bonds.

Figures 4E, 4F:
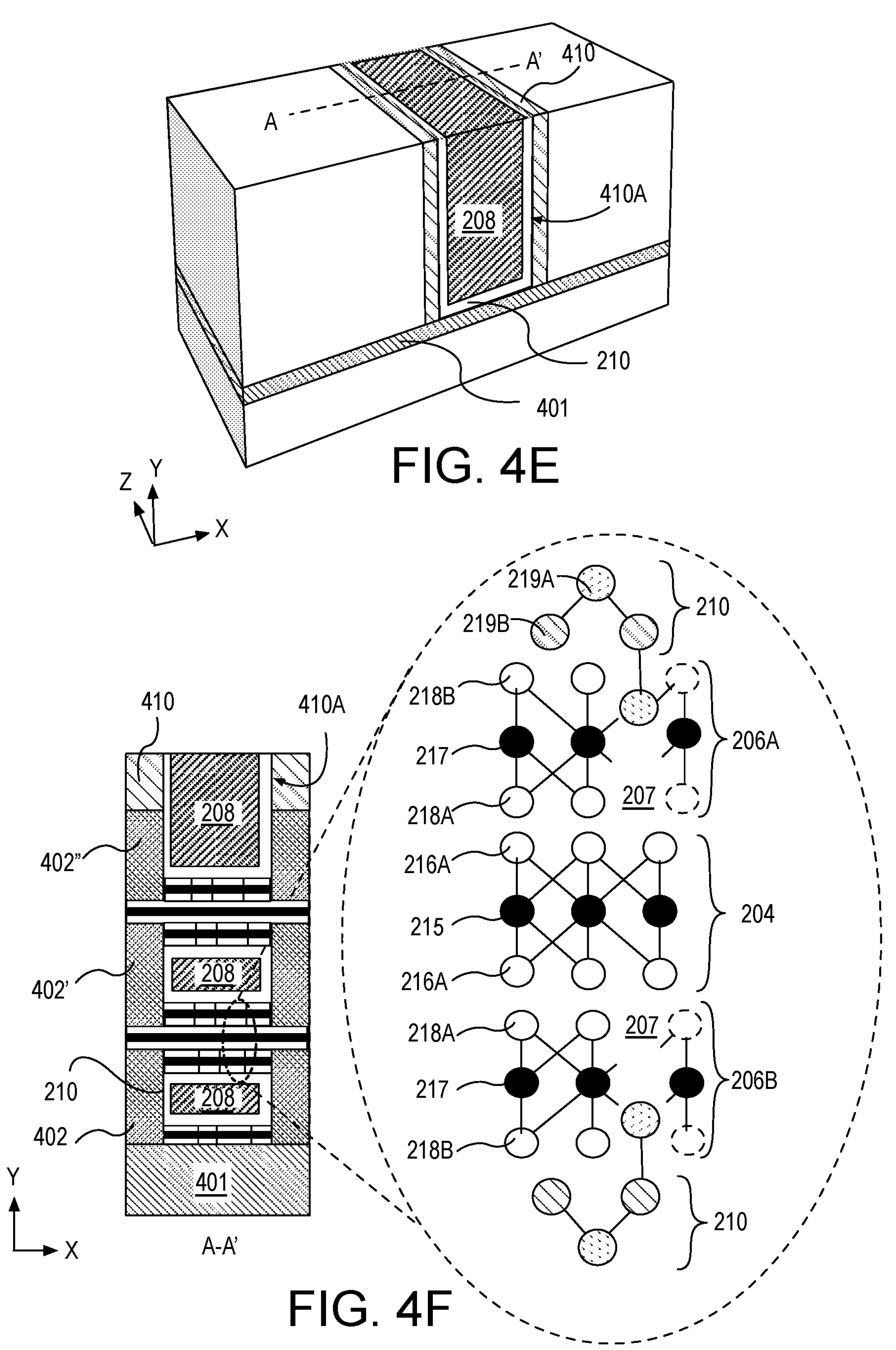

FIG. 4E illustrates the structure shown in FIG. 4C after the formation of a gate insulator 210 on metal chalcogenide material layer 206, and the further formation of a gate electrode 208 on gate insulator 210. Gate insulator 210 may be any of the compositions described above, and may be deposited substantially as described above, for example to a thickness of 0.8 nm to 2 nm. One or more electrically conductive material layers by then be deposited as gate electrode 208. FIG. 4F is a cross-sectional illustration through a line A-A' of FIG. 4E. As shown, gate insulator 210 is in contact with top and bottom surfaces of metal chalcogenide material layer 206 with gate electrode 208 wrapping around an outer surface of gate insulator 210 to complete a nanowire or nanosheet channel structure.

In the expand view inset of FIG. 4E, oxygen atoms 219A and metal atoms 219B of gate insulator 210 are shown to enter dislocations 207 as well as any other binding sites present within metal chalcogenide material layer 206. Accordingly, where metal chalcogenide material layer 204 has a composition of MXn, metal chalcogenide material layer 206 has additional oxygen, for example with a composition of MXnO1-n with 0<n<1.

Figure 4G:
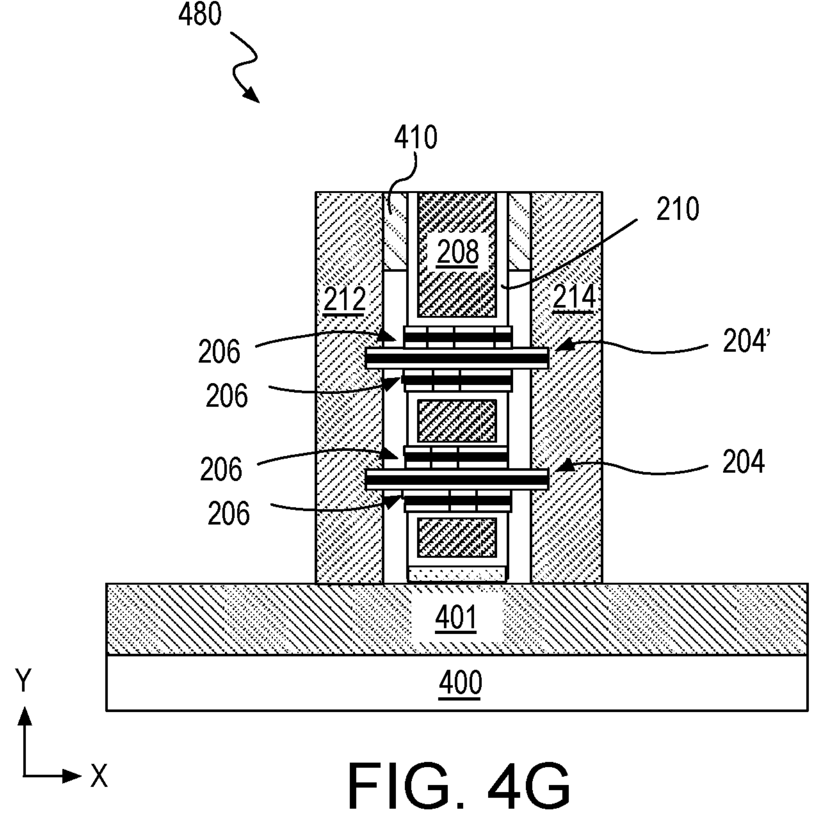

FIG. 4G further illustrates a cross-sectional view of the transistor structure shown in FIG. 4E following the formation of source terminal 212 and drain terminal 214 to complete three terminals of transistor structure 480.

Transistor structures comprising a metal chalcogenide transition layer may be incorporated into any IC circuitry as a portion of any IC chip or die that may be singulated from a workpiece following the completion of any conventional processing. With a metal chalcogenide transition layer in accordance with embodiments herein, gate insulator thickness control and/or uniformity may be improved to improve the performance of the transistor and/or an IC comprising many such transistors.

Figure 5:
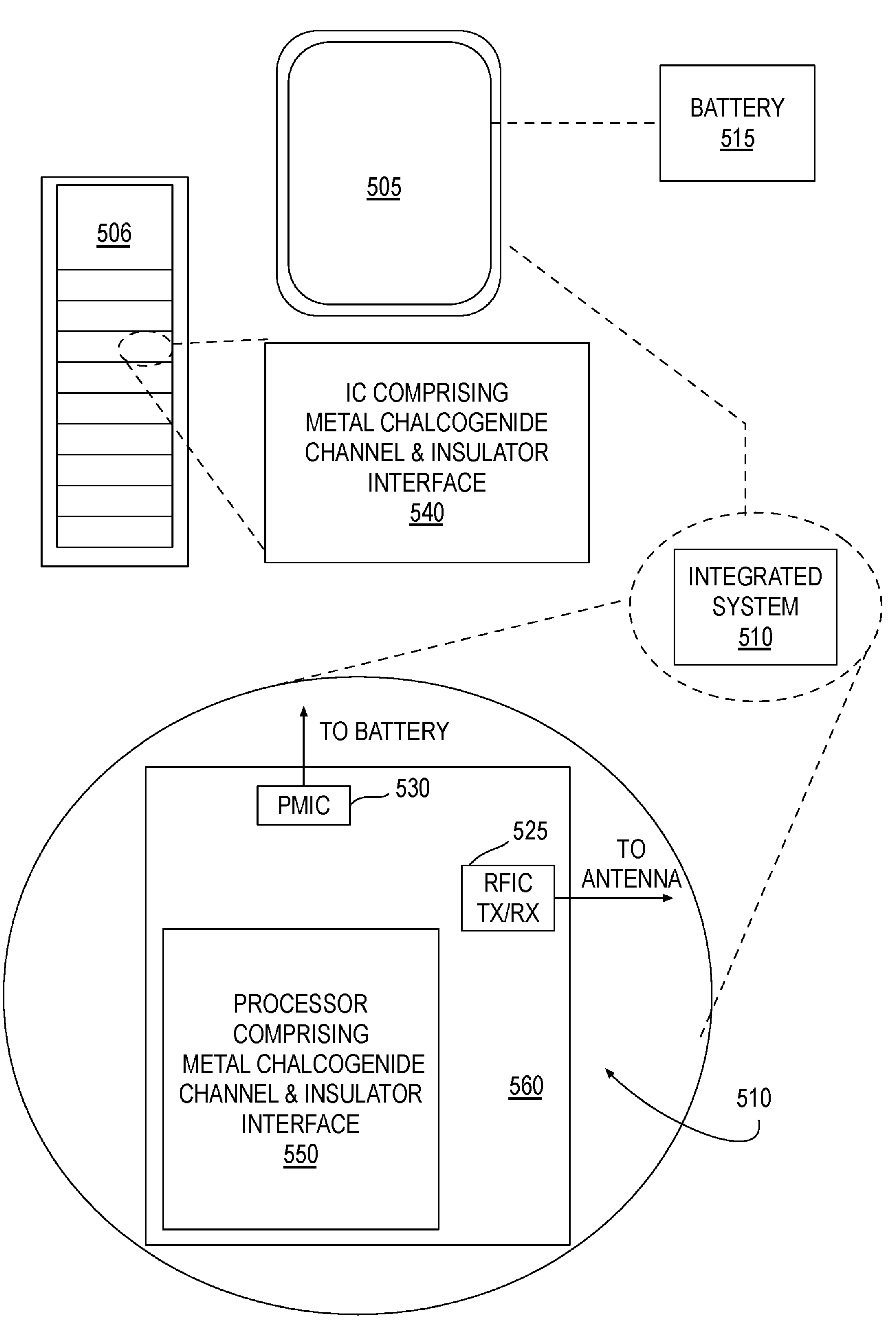
FIG. 5 illustrates a mobile computing platform and a data server machine employing an IC including a transistor structure with a defected metal chalcogenide channel transition layer, in accordance with some embodiments.

FIG. 5 illustrates a mobile computing platform 505 and a data server computing platform 506 employing an IC including transistor structures comprising a metal chalcogenide transition layer, for example substantially as described elsewhere herein. The server platform 506 may be any commercial server, for example including any number of high-performance computing platforms disposed within a rack and networked together for electronic data processing, which in the exemplary embodiment includes an IC 540 including transistor structures comprising a metal chalcogenide transition layer, for example as described elsewhere herein.

The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515. At least one IC of chip-level or package-level integrated system 510 includes transistor structures comprising a metal chalcogenide transition layer, for example substantially as described elsewhere herein.

In the example shown in expanded view 550, integrated system 510 includes microprocessor 501 that includes transistor structures comprising a metal chalcogenide transition layer, for example substantially as described elsewhere herein. Microprocessor 501 may be further coupled to a host substrate 560. One or more of a power management integrated circuit (PMIC) 530, or an RF (wireless) integrated circuit (RFIC) 525 including a wideband RF (wireless) transmitter and/or receiver (TX/RX) may be further coupled to host substrate 560.

Functionally, PMIC 530 may perform battery power regulation, DC-to-DC conversion, etc., and so has an input coupled to battery 515 and with an output providing a current supply to other functional modules (e.g., microprocessor 501). As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 4G, 5G, and beyond.

Figure 6:
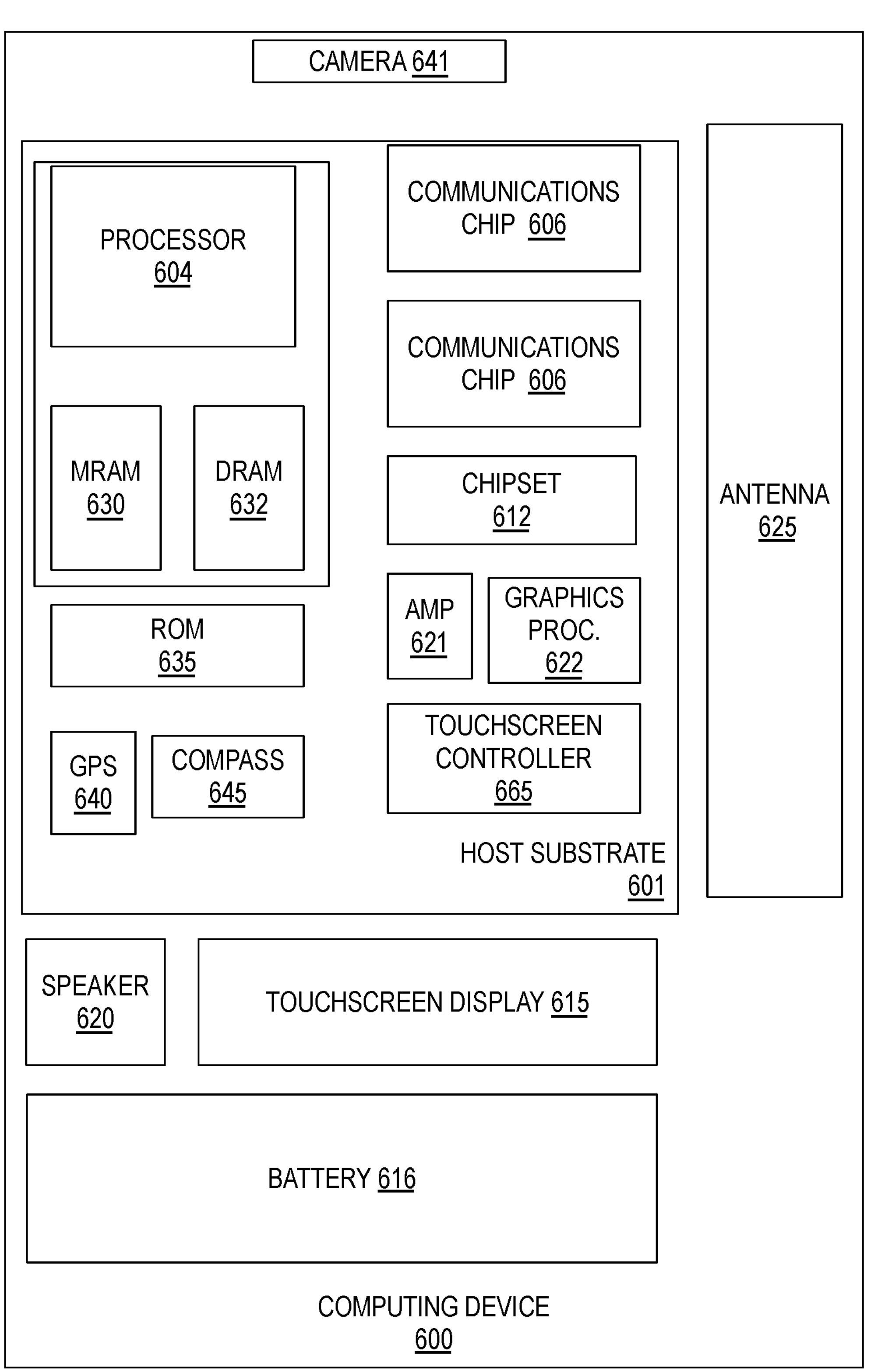
FIG. 6 is a functional block diagram of an electronic computing device, in accordance with some embodiments.

FIG. 6 is a functional block diagram of an electronic computing device 600, in accordance with an embodiment of the present invention. Computing device 600 may be found inside platform 505 or server platform 506, for example. Device 600 further includes a host substrate 601 hosting a number of components, such as, but not limited to, a processor 604 (e.g., an applications processor). Processor 604 may be physically and/or electrically coupled to host substrate 601. In some examples, processor 604 includes transistor structures comprising a metal chalcogenide transition layer, for example substantially as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 606 may also be physically and/or electrically coupled to the host substrate 601. In further implementations, communication chips 606 may be part of processor 604. Depending on its applications, computing device 600 may include other components that may or may not be physically and electrically coupled to host substrate 601. These other components include, but are not limited to, volatile memory (e.g., DRAM 632), non-volatile memory (e.g., ROM 635), flash memory (e.g., NAND or NOR), magnetic memory (MRAM 630), a graphics processor 622, a digital signal processor, a crypto processor, a chipset 612, an antenna 625, touchscreen display 615, touchscreen controller 665, battery 616, audio codec, video codec, power amplifier 621, global positioning system (GPS) device 640, compass 645, accelerometer, gyroscope, speaker 620, camera 641, and mass storage device (such as hard disk drive, solid-state drive (SSD), compact disk (CD), digital versatile disk (DVD), and so forth), or the like. In some exemplary embodiments, at least one of the functional blocks noted above include interconnect structures with low via resistance, for example as described elsewhere herein.

Communication chips 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols, including but not limited to those described elsewhere herein. As discussed, computing device 600 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that the invention is not limited to the embodiments so described, but can be practiced with modification and alteration without departing from the scope of the appended claims. For example the above embodiments may include specific combinations of features as further provided below.

In first examples, a transistor structure comprises a first crystalline material layer comprising a primarily a metal and a chalcogen. The structure comprises a second crystalline material layer in contact with the first layer. The second layer comprises primarily a metal and a chalcogen. The second layer comprises one or more crystal defects that originate within the second layer. The structure comprises a gate insulator in contact with the second layer. The gate insulator comprises primarily a metal and oxygen. The structure comprises a gate electrode separated from the first layer by at least the gate insulator and the second layer, and a source terminal and a drain terminal coupled to the first layer.

In second examples for any of the first examples the second layer has a higher density of dislocation defects than the first layer.

In third examples, for any of the second examples the first layer is monocrystalline, having no grain boundaries, over a distance spanned by gate electrode, and the second layer is polycrystalline, having at least one grain boundary, over the distance spanned by the gate electrode.

In fourth examples, for any of the first through the third examples the first layer has a first crystal orientation, and the second layer has the first crystal orientation.

In fifth examples, for any of the first through fourth examples the metal and the chalcogen of the first layer has a first stoichiometry, and the metal and the chalcogen of the second layer has a second stoichiometry, different than the first.

In sixth examples, for any of the fifth examples the second layer comprises more oxygen than the first layer.

In seventh examples, for any of the sixth examples the first layer has a composition of MXn, with M being the metal, X the chalcogen and $n>1$, and the second layer has a composition of MXnO1-n, with M being the metal, X the chalcogen and $0<n<1$.

In eighth examples, for any of the first through seventh examples the metal of the first layer and the metal of the second layer are the same.

In ninth examples, for any of the eighth examples the metal is molybdenum, tungsten or chromium.

In tenth examples, for any of the firth through ninth examples the chalcogen of the first layer and the chalcogen of the second layer are the same.

In eleventh examples, for any of the tenth examples the chalcogen is S or Se, and the gate insulator comprises Hf.

In twelfth examples, a transistor structure comprises a gate electrode around a channel region of the transistor structure. The channel region comprises a first monocrystalline layer comprising metal chalcogenide material. A first polycrystalline layer is in contact with a first side of the first monocrystalline layer. The first polycrystalline layer comprises metal chalcogenide material and has one or more grain boundaries that originate within the first polycrystalline layer. The channel region comprises a second monocrystalline layer comprising the metal chalcogenide material. second polycrystalline layer is in contact with a first side of the second monocrystalline layer. The second polycrystalline layer comprises metal chalcogenide material and having one or more grain boundaries that originate within the second polycrystalline layer A gate insulator is between the gate electrode and each of first and second polycrystalline layers. A source material is coupled to a first end of the first and second monocrystalline layers, and a drain material is coupled to a second end of the first and second monocrystalline layers.

In thirteenth examples, for any of the twelfth examples the first polycrystalline layer is in contact with a front side and a back side of the first monocrystalline layer, and the second polycrystalline layer is in contact with a front side and a back side of the second monocrystalline layer.

In fourteenth examples, for any of the twelfth through thirteenth examples the first and second polycrystalline layers comprise the same metal and the same chalcogen.

In fifteenth examples, for any of the fourteenth examples the first and second monocrystalline layers comprise the same metal and the same chalcogen as the first and second polycrystalline layers.

In sixteenth examples, a method of forming a transistor structure comprises forming a first crystalline material layer comprising primarily a metal and a chalcogen with a first deposition process. The method comprises forming, on the first layer, a second crystalline material layer comprising primarily a metal and a chalcogen with a second deposition process that induces one or more defects to originate in the second layer. The method comprises forming, on the second layer, a gate insulator comprising a metal and oxygen. The method comprises forming a gate electrode separated from the first layer by at least the gate insulator and the second layer, and forming source and drain terminals to the first layer.

In seventeenth examples, for any of the sixteenth examples the first deposition process comprises a growth process at first conditions, and the second deposition process comprises a growth process at second conditions.

In eighteenth examples, for any of the seventeenth examples the first conditions comprise a first temperature and a first pressure, the second conditions comprise a second temperature and a second pressure, and the second temperature is lower than the first temperature, or the second pressure is lower than the first pressure.

In nineteenth examples, for any of the eighteenth examples the second temperature is at least 100° C. lower than the first temperature.

In twentieth examples, for any of the sixteenth through nineteenth examples the first deposition process comprises epitaxially growing the first layer by MOCVD or MBE, and the second deposition process comprises depositing a layer of metal oxide and converting the layer of metal oxide into the second layer.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. A transistor structure comprising:

a first crystalline material layer comprising primarily a first metal and a first chalcogen;

a second crystalline material layer in contact with the first crystalline material layer, wherein the second crystalline material layer comprises primarily a second metal and a second chalcogen, and wherein the second crystalline material layer comprises smaller crystal grains than are present within the first crystalline material layer;

a gate insulator in contact with the second crystalline material layer, wherein the gate insulator comprises primarily a third metal and oxygen;

a gate electrode separated from the first crystalline material layer by at least the gate insulator and the second crystalline material layer; and a source terminal and a drain terminal coupled to the first crystalline material layer.

2. The transistor structure of claim 1, wherein the second crystalline material layer has a higher density of dislocation defects than the first crystalline material layer.

3. The transistor structure of claim 1, wherein:

the first crystalline material layer is monocrystalline, having no grain boundaries, over a distance spanned by the gate electrode; and the second crystalline material layer is polycrystalline, having at least one grain boundary, over the distance spanned by the gate electrode.

4. The transistor structure of claim 3, wherein the first crystalline material layer has a first crystal orientation, and the second crystalline material layer has the first crystal orientation.

5. The transistor structure of claim 1, wherein:

the first metal and the first chalcogen have a first stoichiometry; and the second metal and the second chalcogen have a second stoichiometry, different than the first.

6. The transistor structure of claim 5, wherein the second crystalline material layer comprises more oxygen than the first crystalline material layer.

7. The transistor structure of claim 6, wherein:

the first crystalline material layer has a composition of $MX_n$, with M being the metal, X the chalcogen and $n>1$; and the second crystalline material layer has a composition of $MX_pO_{1-p}$, with M being the metal, X the chalcogen and $0<p<1$.

8. The transistor structure of claim 1, wherein the first metal and the second metal are the same.

9. The transistor structure of claim 8, wherein the first metal and second metal are both molybdenum, tungsten or chromium.

10. The transistor structure of claim 8, wherein the first chalcogen and the second chalcogen are the same.

11. The transistor structure of claim 10, wherein:

the first chalcogen and the second chalcogen are both S or Se; and the gate insulator comprises Hf.

12. A transistor structure comprising:

a gate electrode coupled to a channel region of the transistor structure, wherein the channel region comprises a monocrystalline layer comprising a first metal chalcogenide material, wherein the monocrystalline layer has a composition of $MX_n$, with M being a metal, X a chalcogen, and n>1;

a polycrystalline layer in contact with the monocrystalline layer, the polycrystalline layer comprising a second metal chalcogenide material and having one or more grain boundaries that originate within the polycrystalline layer, and wherein the polycrystalline layer has a composition of $MX_pO_{1-p}$, with M being the metal, X the chalcogen, and 0<p<1;

a gate insulator between the gate electrode and the polycrystalline layer;

a source material coupled to a first end of the monocrystalline layer; and a drain material coupled to a second end of the monocrystalline layer.

* * * * *